(12) United States Patent
Brophy et al.

(10) Patent No.: US 9,598,586 B2
(45) Date of Patent: Mar. 21, 2017

(54) COATING MATERIALS AND METHODS FOR ENHANCED RELIABILITY

(71) Applicant: Enki Technology, Inc., San Jose, CA (US)

(72) Inventors: Brenor L. Brophy, San Jose, CA (US); Sina Maghsoodi, San Jose, CA (US); Kevin Kopczynski, Woodside, CA (US)

(73) Assignee: Enki Technology, Inc., San Jose, CA (US)

( * ) Notice: Subject to any disclaimer, the term of this patent is extended or adjusted under 35 U.S.C. 154(b) by 0 days.

(21) Appl. No.: 14/799,223

(22) Filed: Jul. 14, 2015

(65) Prior Publication Data

US 2016/0013329 A1    Jan. 14, 2016

Related U.S. Application Data

(63) Continuation-in-part of application No. 14/491,259, filed on Sep. 19, 2014.

(60) Provisional application No. 62/024,440, filed on Jul. 14, 2014.

(51) Int. Cl.
| | |
|---|---|
| *H01L 31/0216* | (2014.01) |
| *C09D 5/24* | (2006.01) |
| *C09D 5/00* | (2006.01) |
| *H01L 31/048* | (2014.01) |
| *C03C 17/00* | (2006.01) |
| *C03C 17/23* | (2006.01) |

(52) U.S. Cl.
CPC .............. *C09D 5/24* (2013.01); *C03C 17/002* (2013.01); *C03C 17/007* (2013.01); *C03C 17/008* (2013.01); *C03C 17/23* (2013.01); *C09D 5/006* (2013.01); *H01L 31/048* (2013.01); *C03C 2217/43* (2013.01); *C03C 2217/475* (2013.01); *C03C 2217/732* (2013.01); *C03C 2217/76* (2013.01); *C03C 2218/113* (2013.01); *C03C 2218/31* (2013.01); *Y02E 10/50* (2013.01); *Y02P 70/521* (2015.11)

(58) Field of Classification Search
CPC ..................... C08K 5/5419; H01L 31/02168
See application file for complete search history.

(56) References Cited

U.S. PATENT DOCUMENTS

| | | | |
|---|---|---|---|
| 2,432,484 A | 12/1947 | Moulton | |
| 4,049,506 A | 9/1977 | Gilding | |
| 4,210,699 A | 7/1980 | Schroeter et al. | |
| 4,246,038 A | 1/1981 | Vaughn, Jr. et al. | |
| 4,319,983 A | 3/1982 | Yoo | |
| 4,387,960 A | 6/1983 | Tani | |
| 4,535,026 A | 8/1985 | Yoldas et al. | |
| 4,687,707 A | 8/1987 | Matsuo et al. | |
| 4,857,613 A | 8/1989 | Zolk et al. | |
| 4,929,278 A | 5/1990 | Ashley et al. | |
| 4,966,812 A | 10/1990 | Ashley et al. | |
| 5,091,460 A | 2/1992 | Seto et al. | |
| 5,368,892 A | 11/1994 | Berquier | |
| 5,527,931 A | 6/1996 | Rich et al. | |
| 5,580,819 A | 12/1996 | Li et al. | |
| 5,698,266 A | 12/1997 | Floch et al. | |
| 5,851,674 A | 12/1998 | Pellerite et al. | |
| 5,858,462 A | 1/1999 | Yamazaki | |
| 6,054,601 A | 4/2000 | Standke et al. | |
| 6,177,131 B1 | 1/2001 | Glaubitt et al. | |
| 6,183,872 B1 | 2/2001 | Tanaka et al. | |
| 6,277,485 B1 | 8/2001 | Invie et al. | |
| 6,312,152 B2 | 11/2001 | Dee et al. | |
| 6,337,133 B1 | 1/2002 | Akamatsu et al. | |
| 6,376,064 B1 | 4/2002 | Gasworth et al. | |
| 6,472,073 B1 | 10/2002 | Singh et al. | |
| 6,506,496 B1 | 1/2003 | Frugier et al. | |
| 6,556,228 B1 | 4/2003 | Camis | |

(Continued)

FOREIGN PATENT DOCUMENTS

| | | |
|---|---|---|
| DE | 10253841 A1 | 5/2004 |
| EP | 1181256 B1 | 3/2006 |

(Continued)

OTHER PUBLICATIONS

"Figures 4a and 4b from U.S. Appl. No. 13/184,568", 2012, 1 Page.
12815529.8, "European Application Serial No. 12815529.8, European Extended Search Report mailed Jan. 22, 2015", Southern Illinois University Carbondale, 8 Pages.
12815529.8, "European Application Serial No. 12815529.8, Examination Notification Art. 94(3) mailed Sep. 4, 2015", Southern Illinois University Carbondale, 5 Pages.
12815529.8, "European Application Serial No. 12815529.8, Communication Pursuant to Article 94(3) EPC mailed Jan. 22, 2016", Southern Illinois University Carbondale, 6 pages.
201280045439.5, "Chinese Application Serial No. 201280045439. 5, First Office Action mailed May 5, 2015", Bakul Champaklal Dave, 19 Pages.
201280045439.5, "Chinese Application Serial No. 201280045439. 5, Second Office Action mailed Dec. 8, 2015", Enki Technology, Inc., 10 pages.

(Continued)

*Primary Examiner* — Kuo-Liang Peng
(74) *Attorney, Agent, or Firm* — GTC Law Group PC & Affiliates

(57) ABSTRACT

Glass coating materials and methods are disclosed for the coating of glass substrates used in the manufacturer of photovoltaic solar modules such that the coating enhances the reliability of the module by reducing its susceptibility to potential induced degradation (PID). Coating materials are disclosed that reduce soiling on the front surface of the glass; that increase the surface resistivity of the glass and that repel moisture and that seal the surface from the ingress of moisture. Further electrically conductive coatings are disclosed that reduce the electric field between the front and back surfaces of the glass and hence reduce ion mobility within the glass and transport from the interior glass surface to the solar cell. There are additional configuration choices for fine tuning associated with separately optimizing the exterior and interior glass coating. Finally, coating processes and methods are disclosed for coating glass substrates with the disclosed materials.

27 Claims, 3 Drawing Sheets

(56) References Cited

U.S. PATENT DOCUMENTS

| | | | |
|---|---|---|---|
| 6,692,832 B2 | 2/2004 | Murphy | |
| 6,768,048 B2 | 7/2004 | Woll et al. | |
| 6,828,381 B1 | 12/2004 | Armbrust et al. | |
| 6,902,767 B2 | 6/2005 | Kelsoe | |
| 6,906,115 B2 | 6/2005 | Hanazawa et al. | |
| 6,942,924 B2 | 9/2005 | He et al. | |
| 6,997,018 B2 | 2/2006 | Sakoske et al. | |
| 7,128,778 B2 | 10/2006 | Thompson | |
| 7,128,944 B2 | 10/2006 | Becker et al. | |
| 7,241,505 B2 | 7/2007 | Glaubitt et al. | |
| 7,345,351 B2 | 3/2008 | Moon et al. | |
| 7,351,449 B2 | 4/2008 | Hunt et al. | |
| 7,575,809 B2 | 8/2009 | Glaubitt et al. | |
| 7,588,823 B2 | 9/2009 | Taylor | |
| 7,635,522 B2 | 12/2009 | Cnossen et al. | |
| 7,642,199 B2 | 1/2010 | Meredith et al. | |
| 7,704,608 B2 | 4/2010 | Thies et al. | |
| 8,217,261 B2 | 7/2012 | Wieting | |
| 8,263,312 B2 | 9/2012 | Fu et al. | |
| 8,304,161 B2 | 11/2012 | Bradford et al. | |
| 8,557,877 B2 | 10/2013 | Mukhopadhyay et al. | |
| 8,668,960 B1 | 3/2014 | Hanumanthu et al. | |
| 8,864,897 B2 | 10/2014 | Nair et al. | |
| 9,353,268 B2 | 5/2016 | Brophy et al. | |
| 9,376,589 B2 | 6/2016 | Maghsoodi et al. | |
| 9,376,593 B2 | 6/2016 | Maghsoodi et al. | |
| 9,382,449 B2 | 7/2016 | Maghsoodi et al. | |
| 9,399,720 B2 | 7/2016 | Maghsoodi et al. | |
| 2001/0031811 A1 | 10/2001 | Li et al. | |
| 2002/0090519 A1 | 7/2002 | Kursawe et al. | |
| 2002/0090739 A1 | 7/2002 | Laguitton | |
| 2002/0150765 A1 | 10/2002 | Chang et al. | |
| 2006/0286813 A1 | 12/2006 | Meredith et al. | |
| 2006/0292345 A1 | 12/2006 | Dave et al. | |
| 2007/0074757 A1 | 4/2007 | Mellott et al. | |
| 2007/0116970 A1 | 5/2007 | Kato et al. | |
| 2007/0148435 A1 | 6/2007 | Meredith et al. | |
| 2007/0184247 A1 | 8/2007 | Simpson et al. | |
| 2007/0264437 A1 | 11/2007 | Zimmermann et al. | |
| 2008/0014335 A1 | 1/2008 | Fu et al. | |
| 2008/0063859 A1 | 3/2008 | Fath | |
| 2008/0113188 A1 | 5/2008 | Shah et al. | |
| 2008/0248312 A1 | 10/2008 | Thies et al. | |
| 2008/0271782 A1 | 11/2008 | Sharma et al. | |
| 2009/0029145 A1 | 1/2009 | Thies et al. | |
| 2009/0043025 A1 | 2/2009 | Tsujimoto et al. | |
| 2009/0087665 A1 | 4/2009 | Suzuki et al. | |
| 2009/0151773 A1* | 6/2009 | Hayes | B32B 17/10018 136/251 |
| 2009/0191346 A1 | 7/2009 | Thies et al. | |
| 2009/0194165 A1 | 8/2009 | Murphy et al. | |
| 2009/0285993 A1 | 11/2009 | Kang et al. | |
| 2010/0015454 A1 | 1/2010 | Anderson et al. | |
| 2010/0016502 A1 | 1/2010 | Rentrop et al. | |
| 2010/0101649 A1 | 4/2010 | Huignard et al. | |
| 2010/0221557 A1 | 9/2010 | Higuchi et al. | |
| 2010/0275815 A1 | 11/2010 | Dave | |
| 2010/0313950 A1 | 12/2010 | Mukhopadhyay et al. | |
| 2011/0003130 A1 | 1/2011 | Marchet et al. | |
| 2011/0151146 A1 | 6/2011 | Okano et al. | |
| 2011/0236835 A1 | 9/2011 | Fu et al. | |
| 2011/0308602 A1* | 12/2011 | Junghanel | H01L 31/02168 136/256 |
| 2012/0040179 A1* | 2/2012 | Dave | C03C 17/30 428/336 |
| 2012/0225215 A1 | 9/2012 | Kalyankar | |
| 2012/0251718 A1 | 10/2012 | Kalyankar et al. | |
| 2013/0034653 A1 | 2/2013 | Kumar et al. | |
| 2013/0034722 A1 | 2/2013 | Kalyankar et al. | |
| 2013/0095237 A1 | 4/2013 | Kalyankar et al. | |
| 2013/0180580 A1 | 7/2013 | Krasnov et al. | |
| 2013/0186466 A1 | 7/2013 | Hebrink et al. | |
| 2014/0004334 A1 | 1/2014 | Kalyankar | |
| 2014/0011019 A1 | 1/2014 | Mukhopadhyay et al. | |
| 2014/0150850 A1 | 6/2014 | Hwang | |
| 2014/0166092 A1 | 6/2014 | Kozinsky et al. | |
| 2014/0170403 A1 | 6/2014 | Tang et al. | |
| 2014/0261615 A1 | 9/2014 | Nair et al. | |
| 2014/0261673 A1 | 9/2014 | Nair et al. | |
| 2014/0272126 A1 | 9/2014 | Liang et al. | |
| 2015/0037570 A1 | 2/2015 | Brophy et al. | |
| 2016/0002498 A1 | 1/2016 | Maghsoodi et al. | |
| 2016/0032141 A1 | 2/2016 | Maghsoodi et al. | |
| 2016/0032147 A1 | 2/2016 | Maghsoodi et al. | |
| 2016/0035912 A1 | 2/2016 | Nair et al. | |
| 2016/0083620 A1 | 3/2016 | Maghsoodi et al. | |
| 2016/0289457 A1 | 10/2016 | Maghsoodi et al. | |

FOREIGN PATENT DOCUMENTS

| | | |
|---|---|---|
| EP | 1674891 A1 | 6/2006 |
| JP | 02264074 A | 10/1990 |
| JP | 04085380 A | 3/1992 |
| JP | 09048640 A | 2/1997 |
| JP | 2002053806 A | 2/2002 |
| JP | 2003201443 A | 7/2003 |
| JP | 2005196802 A | 7/2005 |
| JP | 2006215542 A | 8/2006 |
| KR | 1020140065250 A | 5/2014 |
| WO | 9743224 A1 | 11/1997 |
| WO | 0010934 A1 | 3/2000 |
| WO | 0064830 A1 | 11/2000 |
| WO | 2004044071 A2 | 5/2004 |
| WO | 2004051755 A1 | 6/2004 |
| WO | 2005044554 A2 | 5/2005 |
| WO | 2007068545 A2 | 6/2007 |
| WO | 2008027698 A1 | 3/2008 |
| WO | 2008074823 A1 | 6/2008 |
| WO | 2010127034 A1 | 11/2010 |
| WO | 2013012753 A1 | 1/2013 |
| WO | 2014193513 | 12/2014 |
| WO | 2014193513 A3 | 2/2015 |
| WO | 2016011041 A1 | 1/2016 |
| WO | 2016011071 A2 | 1/2016 |
| WO | 2016011071 A3 | 3/2016 |
| WO | 2016064494 A2 | 4/2016 |
| WO | 2016064494 A3 | 4/2016 |

OTHER PUBLICATIONS

2014521679, "Japanese Application U.S. Appl. No. 2014521679, Office Action mailed Oct. 14, 2015", Bakul Champaklal Dave, 11 Pages.

Abrams, et al., "Field and Lab Verification of Hydrophobic Anti-Reflective and Anti-Soiling Coatings on Photovoltaic Glass", Topic 5BV.1.50: Operation of PV Systems and Plants, presented at the 29th European PV Solar Energy Conference and Exhibition (EUPVSEC), Amsterdam, The Netherlands, Sep. 22-26, 2014, 6 pages.

Abrams, et al., "Field Performance Gains of Anti-Soiling & Anti-Reflective Photovoltaic Glass Coating", SNEC 2014—The 8th International Photovoltaic Power Generation Conference & Exhibition, Shanghai, China, May 20-22, 2014, 7 pages.

Aegerter, et al., "Coatings made by Sol-Gel and Chemical Nanotechnology", J. Sol-Gel Sci. Technol., vol. 47, Jun. 5, 2008, pp. 203-236.

Cuddihy, et al., "Antisoiling Technology: Theories of Surface Soiling and Performance of Antisoiling Surface coatings", JPL Publication 84-72, JPL Document 5101-251, DOE/JPL-1012-102, Jet Propulsion Laboratory, Pasadena, California, Nov. 15, 1984, 38 pages.

Garcia, et al., "Soiling and other optical losses in solar-tracking PV plants in Navarra", Progress in Photovoltaics: Research and Applications, vol. 19, Iss. 2,, Mar. 2011, pp. 211-217.

Hacke, et al., "Characterization of Multicrystalline Silicon Modules with System Bias Voltage Applied in Damp Heat", Presented at the 25th European Photovoltaic Solar Energy, Conference and Exhibition (EUPVSEC), Valencia, Spain, Sep. 6-10, 2010, Conference Paper NREL/CP-5200-49344, Jul. 2011, 8 pages.

Hacke, et al., "System voltage potential-induced degradation mechanisms in PV modules and methods for test", Presented at the

(56) References Cited

OTHER PUBLICATIONS

37th IEEE Photovoltaic Specialists Conference (PVSC), Seattle, Washington, Jun. 19-24, 2011, Jul. 2011, 9 pages.

Hacke, et al., "Test-to-Failure of Crystalline Silicon Modules", Presented at the 35th IEEE Photovoltaic Specialists conference, Honolulu, Hawaii, Jun. 20-25, 2010, Conference Paper NREL/CP-5200-47755, Oct. 2010, 10 pages.

Kimber, et al., "The Effect of Soiling on Large Grid-Connected Photovoltaic Systems in California and the Southwest Region of the United States", Conference Record of the 2006 IEEE 4th World Conference on Photovoltaic Energy conversion, vol. 2, May 2006, pp. 2391-2395.

Makita, et al., "Sol-Gel Preparation of Silica Films with Controlled Surface Morphology and Their Application to a Low Reflective Glass", Journal of Sol-Gel Science and Technology, vol. 14, 1999, pp. 175-186.

Nocuń, et al., "Sodium diffusion barrier coatings prepared by sol-gel method", Optica Applicata, vol. XXXVII, No. 1,, 2008, pp. 171-179.

PCT/US2010/032823, "International Preliminary Report on Patentability for International Application Serial No. PCT/US2010/032823 mailed Nov. 10, 2011", 5 pages.

PCT/US2010/032823, "International Search Report and Written Opinion for International Application Serial No. PCT/US2010/032823 mailed Jun. 28, 2010", 7 pages.

PCT/US2012/046791, "International Application Serial No. PCT/US2012/046791, International Preliminary Report on.Patentability and Written Opinion mailed Jan. 30, 2014", Southern Illinois University Carbondale et al, 7 pages.

PCT/US2012/046791, "International Search Report and Written Opinion for International Application Serial No. PCT/US2012/046791 mailed Sep. 21, 2012", 8 pages.

PCT/US2014/022857, "International Application Serial No. PCT/US2014/022857, International Preliminary Report on Patentability and Written Opinion mailed Sep. 24, 2015", Enki Technology, Inc., 5 Pages.

PCT/US2014/022857, "International Application Serial No. PCT/US2014/022857, International Search Report and Written Opinion mailed Dec. 19, 2014", Enki Technology, Inc., 8 Pages.

PCT/US2015/040393, "International Application Serial No. PCT/US2015/040393, International Search Report and Written Opinion mailed Nov. 13, 2015", Enki Technology, Inc., 11 pages.

PCT/US2015/040440, "International Application Serial No. PCT/US2015/040440 International Search Report and Written Opinion mailed Feb. 5, 2016", Enki Technology, Inc., 17 pages.

PH1-2014-500172, "Philippines Application Serial No. 1-2014-500172, Office Action Mailed May 22, 2014", Enki Technology, Inc., 1 Page.

Pingel, et al., "Potential Induced Degradation of solar cells and panels", 35th IEEE Photovoltaic Specialists conference (PVSC), 2010, 6 pages.

Pop, et al., "A Highly Abrasive-Resistant, Long-Lasting Anti-Reflective Coating for PV Module Glass", 40th IEEE Photovoltaic Specialists Conference, Denver, Colorado, USA, Jun. 8-13, 2014, 5 pages.

Rose, et al., "Mass Production of PV Modules with 18% Total-Area Efficiency and High Energy Delivery Per Peak Watt", Conference Record of the 2006 IEEE 4th World Conference on Photovoltaic Energy Conversion (WCPEC), vol. 2, Waikoloa, HI, May 7-12, 2006, pp. 2018-2023.

San Vicente, et al., "Long-term durability of sol-gel porous coatings for solar glass covers", Thin Solid Films, vol. 517, issue 10, Mar. 31, 2009 (e-version 2008), pp. 3157-3160.

San Vicente, et al., "Surface modification of porous antireflective coatings for solar glass covers", Solar Energy, vol. 35, issue 4, Apr. 2011 (e-version 2010), pp. 676-680.

Schutze, et al., "Laboratory study of potential induced degradation of silicon photovoltaic modules", 37th IEEE Photovoltaic Specialists Conference (PVSC), 2011, 6 pages.

Tatapudi, "Potential Induced Degradation (PID) of Pre-Stressed Photovoltaic Modules: Effect of Glass Surface conductivity Disruption", Master of Science in Technology Thesis, Arizona State University, Dec. 2012, 110 pages.

Kiu, et al., "Fabrication of Surface Micro-And Nanostructures for Superhydrophobic Surfaces in Electric and Electronic Applications", In Partial Fulfillment of the Requirements for the Degree Doctor of Philosophy in the School of Chemical and Biomolecular Engineering, Georgia Institute of Technology, Dec. 2008, 287 Pages.

Xu, et al., "Comparative study on hydrophobic anti-reflective films from three kinds of methyl-modified silica sols", Journal of Non-Crystalline Solids, vol. 351, 2005, pp. 258-266.

Xu, et al., "Durable solgel antireflective films with high laser-induced damage thresholds for inertial confinement fusion", J. Opt. Soc. Am. B, vol. 22, No. 4, Apr. 2005, pp. 905-912.

Yan, et al., "SiO2 As Barrier Layer for Na Out-Diffusion from Soda-Lime Glass", 35th IEEE Photovoltaic Specialists Conference (PVSC), Jun. 20-25, 2010, Honolulu, HI, 2010, pp. 002519-002521.

201280045439.5, "Chinese Application Serial No. 201280045439.5, Third Office Action mailed Jun. 20, 2016", Enki Technology, Inc., 11 Pages.

PCT/US2015/050561, "International Application Serial No. PCT/US2015/050561, International Search Report and ritten Opinion mailed Jun. 15, 2016", Enki Technology, Inc., 12 Pages.

* cited by examiner

COATING MATERIALS AND METHODS FOR ENHANCED RELIABILITY

CROSS-REFERENCE TO RELATED APPLICATIONS

This application claims the benefit of the following provisional application, which is hereby incorporated by reference in its entirety: U.S. Provisional Appl. 62/024,440, of the same title, filed Jul. 14, 2014. This application is a continuation-in-part of U.S. patent application Ser. No. 14/491,259, filed Sep. 19, 2014, entitled Optical Enhancing Durable Anti-reflective Coating, which is hereby incorporated by reference in its entirety.

BACKGROUND

Field

The present disclosure relates generally to the field of thin-film sol-gel coatings and in particular to coating on substrates such as glass or solar panels.

Description of Related Art

A significant reliability concern for photovoltaic (PV) solar modules is potential induced degradation (PID). PID is caused by interactions between the environment (heat, humidity) and elements within the PV solar module that lead to a degradation in the output power of the PV solar module over time. It is generally believed that PID occurs when the module's voltage potential and leakage current drive ion mobility within the module between the semiconductor material and other elements of the module (e.g. glass, mount and frame) causing the module's power output capacity to degrade. The ion mobility accelerates with humidity, temperature and voltage potential. Tests have revealed the relationship of mobility to temperature and humidity, Pingel, S., et al. "Potential Induced Degradation of solar cells and panels." Photovoltaic Specialists Conference (PVSC), 2010 35th IEEE. Some studies have identified the soda lime glass used in the PV solar panel as the source of positive sodium ions and other metallic ions that may be the prime cause of PID; Schutze, M., et al. "Laboratory study of potential induced degradation of silicon photovoltaic modules." Photovoltaic Specialists Conference (PVSC), 2011 37th IEEE; Hacke, Peter, et al. "System voltage potential-induced degradation mechanisms in PV modules and methods for test." Photovoltaic Specialists Conference (PVSC), 2011 37th IEEE.

In general, susceptibility to PID can be reduced by minimizing leakage currents induced by the high potential on the module. Two approaches have been useful in reducing susceptibility to PID. First, the encapsulating materials used to bind the glass to the solar cells and back-sheets have been shown to have a significant effect on PID. Encapsulating materials such as ethylene-vinyl acetate (EVA) with low resistance to moisture intrusion or with low electrical resistance are particularly problematic. Therefore, PV module manufacturers have tested advanced encapsulating material such as Enlight™ polyolefin from Dow Chemical, which are formulated to eliminate PID. However, these materials tend to be significantly more expensive than the competing materials such as EVA, which are more PID prone. Second, studies have shown that the anti-reflective, passivating coating applied to the PV cell itself can have a significant effect. This has led to approaches to engineer protective cell coatings that can reduce PID effects such as silicon nitride cell coatings without porosity using methods that sometimes include increasing density and/or thickness. One complication of silicon nitride modification is that it also sub-optimizes refractive index or complicates process control and cost. Increasing the silicon nitride thickness increases cost and may also reduce overall module conversion efficiency.

U.S. patent application Ser. No. 13/690,954 teaches that a hydrophobic coating covering at least a portion of the frame and at least a portion of the glass sheet may help prevent PID. Also Tatapudi, S. R. V. (2012) "Potential Induced Degradation (PID) of Pre-Stressed Photovoltaic Modules: Effect of Glass Surface Conductivity Disruption" (master's thesis). Arizona State University, Tempe Ariz., teaches that a hydrophobic but high transmittance surface coating (such as Teflon) could disrupt the surface conductivity of the glass by modifying the frame/edges with water repellent properties.

Several references discuss sodium barriers that prevent or retard the migration of sodium out of soda-lime glass to solve several problems. U.S. Pat. No. 8,217,261 teaches a sputtered or sol-gel deposited $SiO_2$ barrier layer between soda-lime glass and the molybdenum electrode layer in a CIGS PV solar module. The barrier layer prevents the migration of too much sodium into the CIGS absorber layer caused by thermal processing during manufacture. Nocuń, Marek, et al. "Sodium diffusion barrier coatings prepared by sol-gel method", Optica Applicata, Vol. XXXVIII, No. 1, 2008, describes various spin-coated sol-gel barrier layers designed to protect the tin or indium conductive transparent thin-film layers that are used in some electronics devices from migration of sodium from the glass substrate. Yan, Yanfa, et al. "$SiO_2$ as barrier layer for Na out-diffusion from soda-lime glass" Photovoltaic Specialists Conference (PVSC), 2011 37th IEEE, found that a sputtered $SiO_2$ layer could be an effective sodium barrier for F-doped $SnO_2$ coated soda-lime glass as used by commercial CdTe thin-film PV solar module manufacturers to prevent sodium out-diffusion caused by thermal processing at 550° C. to 650° C. Rose, Doug, et al. "Mass production of PV modules with 18% total-area efficiency and high energy per peak watt," Conference Record of the 2006 IEEE 4th World Conference on Photovoltaic Energy Conversion, stated that a 4-layer sputtered anti-reflective coating called PV-Lite manufactured by Saint Gobain Glass prevented leaching of alkalis from the glass that could cause degradation of the glass surface. Hacke, Peter, et al. "Test-to-Failure of Crystalline Silicon Modules," Photovoltaic Specialists Conference (PVSC), 2010 35th IEEE found that modules with an AR coating on the glass exhibited better power retention through PID testing with negative bias than those without such a coating and suggested that this was consistent with the use of oxide barrier layers in thin-film modules that are used to minimize sodium migration that causes degradation. Hacke, Peter, et al. "Characterization of Multicrystalline Silicon Modules with System Bias Voltage Applied in Damp Heat," 25th European Photovoltaic Solar Energy Conference (EUPVSEC) 2010, found that soda-lime glass with an added $SiO_2$ barrier, as used by thin-film PV industry to mitigate sodium migration, performed in an intermediate manner (compared to glass without such a barrier), but still showed significant degradation during negatively biased PID testing. The paper concluded that higher electrical resistance packaging will help reduce electrolytic and ion migration-related degradation, which can be controlled by choices including the glass and its coatings, the encapsulant and the frame.

PID remains a significant problem for PV solar module reliability. It would therefore be advantageous if there were low cost materials and methods to eliminate PID without adversely impacting solar conversion efficiency.

SUMMARY

The present disclosure provides materials and methods for coating the glass within PV solar modules such that the movement of ions, particularly alkali metallic ions and most particularly sodium ions, from the glass to the rest of the module is retarded, reduced or eliminated as a cause for PID. Several properties of the coatings work individually or in combination to provide this benefit.

In some embodiments a coating increases the electrical surface resistance of the outside of the glass and so acts to reduce the flow of leakage current across the glass. The increase in surface resistance may be accomplished by use of a water repellant or hydrophobic coating, or an anti-soiling, dust and dirt repellant coating that reduces leakage currents through surface contamination such as for example water, salt deposits, dirt deposits or a combination of some or all of these elements.

In some embodiments a coating may seal the surface and retard, reduce or eliminate the ingress of liquid water, water vapor and other chemicals into the glass. For example, water on the surface of a PV solar module may be acidic or alkali depending on pollution levels such as atmospheric $CO_2$ or $SO_2$, or may have industrial contamination such as cement dust and windborne particulates of diverse and unknown composition, or geologic conditions such as alkali lake deposits and volcanic ash. Furthermore, sea mist and fog containing high concentrations of dissolved salts can also deposit on the surface of PV solar modules. These surface chemistries, if allowed to condense on or contact the glass, may increase ion mobility within the glass and leaching of ions from the glass. In some embodiments the outside of the glass is coated, or the inside is coated or both sides are coated.

It is advantageous that the coating itself be comprised of materials that are substantially free of alkali metal ions.

Coatings that seal the surface of the glass may be particularly beneficial when placed on the inside because it is generally believed that ions most easily reach the PV solar cell from the inside surface of the glass. Moisture can reach this surface by diffusion through the PV solar module back-sheet, encapsulant edges and terminations such as via junction box pathways. Although PV solar module back-sheets can be glass (in so called "glass-glass" modules), for cost reasons they are typically made of polymeric materials such as, Tedlar® polyvinyl fluoride (PVF) from DuPont, Kynar® polyvinylidene fluoride (PVDF) from Arkema or Scotchshield™ film from 3M that is composed of a polymer of tetrafluoroethylene, hexafluoropropylene and vinylidene fluoride (THV). All such polymeric materials may be substantially more permeable to water vapor than glass and show water vapor transmission rate (WVTR) of 3–8 g/m²-day. Although certain polyolefin encapsulant materials (such as Dow Enlight™) show relatively low WVTR of 3–4 g/m²-day, more commonly used EVA has a WVTR of greater than 30 g/m²-day, allowing moisture to readily migrate within the module once past the back-sheet. In addition to water transmission, acetic acid and methanol derived from commonly used EVA encapsulant materials can assist in transporting ions from the inside surface of the glass to the solar cells.

In some embodiments coatings on the inside of the glass act as a barrier to ion mobility such that ions cannot travel across the coating or ions are trapped and immobilized within the coating.

Ion mobility and direction of travel are mediated by the electrical field between the solar cells and the ground potential usually found on the module frame. In some embodiments the coating acts to create an equipotential between the outside and inside the glass. If both the outside and inside surfaces of the glass are at the same potential, then no electrical field exists within the glass to assist ion travel. Furthermore, the outside surface of the glass can be close to ground potential due to the many low resistance paths between it and the grounded module frame. Thus, if the inside surface of the glass is electrically connected to the outside surface, then the potential on the inside of the glass will also be close to ground potential. This essentially removes the electromotive force driving ions out of the glass cross-section. In some embodiments an electrically conductive coating is applied on the inside surface of the glass and additionally may be applied on the outside surface of the glass and additionally applied on the edges of the glass. The sheet resistance of the coating is less than about $10^{10} \Omega/\square$, between about $10^6 \Omega/\square$ and about $10^3 \Omega/\square$ and between about $200 \Omega/\square$ and about $5 \Omega/\square$, using compositions associated with typical transparent conductors. Sheet resistance is also known as $\Omega/sq$ or $\Omega$ per square and is intended as a sheet resistance only, not a bulk resistance.

The present disclosure further provides coating compositions comprising a gel formed from a sol comprising a polysilsesquioxane, a solvent, optionally a catalyst, and optionally other additives wherein the coating compositions are converted to a dry gel upon evaporation of the solvent(s) that is subsequently cured to form a coating on a glass substrate having a desired combination of properties such as hardness, refractive index, surface contact angle, and ion and moisture permeability.

In some embodiments, the coating compositions include a combination of sols having the following formula A:

$[RSi(OH)_2O_{0.5}]_a[RSiO_{1.5}]_b[RSi(OH)O]_c$
$[R'Si(OH)_2O_{0.5}]_m[R'SiO_{1.5}]_n[R'Si(OH)O]_p$
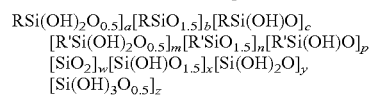
$[Si(OH)_3O_{0.5}]_z$ In the Chemical structure A, R is independently methyl or optionally substituted or unsubstituted C2 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted carboxyl group, a substituted or unsubstituted (meth)acryl group a substituted or unsubstituted glycidylether group, or a combination thereof; R' is a fluorine substituted C3 alkyl group or optionally C4 to C10 alkyl group, a fluorine substituted C3 to C20 cycloalkyl group, a fluorine substituted C1 to C10 hydroxyalkyl group, a fluorine substituted aryl group, a fluorine substituted C2 to C20 heteroaryl group, a fluorine substituted C2 to C10 alkenyl group, a fluorine substituted carboxyl group, a fluorine substituted (meth)acryl group, a fluorine substituted glycidylether group, or a combination thereof; and $0<a,b,c,w,x,y,z<0.9$, $0 \leq m,n,p<0.9$, and $a+b+c+m+n+p+w+x+y+z=1$.

In some embodiments, the composition of the coating composition is based upon a precise selection of solvent, pH, solvent to water ratio, and solvent to silane ratio that allows the resulting sol to remain stable for a significant period of time without exhibiting change in its chemical or physical characteristics. In some embodiments, the composition of the coating composition is based upon controlling the precise amounts and/or ratios of the different silanes in the coating composition. The amount of the silanes in the coating composition can be used to control the final composition and thickness of the coating while the ratio of the different silanes in the coating composition can be used to tune other properties.

The present disclosure further provides methods for applying the coatings and for using such coatings. In some embodiments, the methods of treating a substrate comprises pretreatment of the substrate based on combination of washing, chemical treatment, etching, and/or polishing or cleaning steps and the like that enable better interaction of the sol with the surface of the glass for making a coating with thickness ranging from 50 nm to 20 μm. Thereafter, in some embodiments, the methods include applying the sol to the surface of the glass substrate and allowing the sol to gel to form the coating with the desired properties. Pretreatment methods for annealed or tempered, float or patterned glass or other kinds of glass substrates could be of a similar nature. In some embodiments, the application of the sol to the substrate includes dip coating, flow coating, roll coating, spray coating and slot-die coating that result in uniform deposition of the sol to form an even, uniform and crack-free coating. In some embodiments, the method includes thermally treating the coated articles under specific conditions of heat between about 100° C. to about 300° C. and between about 100° C. and about 500° C. and between about 100° C. and about 700° C. and under a commercial glass tempering process to form a hard, chemically durable coating that adheres strongly to the substrate without cracking and/or delamination.

In one embodiment, the disclosure comprises a PID resistance photovoltaic solar module. The module includes a front cover-glass with a coating, a first layer of encapsulant, at least one photovoltaic solar cell, a second layer of encapsulant and a back cover-sheet, wherein the front cover-glass with the coating has an anti-reflective property, a hydrophobic property and an enhanced ion-migration blocking property when compared to the same front cover-glass without the coating; and wherein the front cover-glass is coated on at least one surface selected from a front, a back and at least one edge.

Another embodiment is a method of manufacturing a PID resistant photovoltaic solar module. The method includes step of (i) preparing a coating composition that contains a combination of sols having a formula:

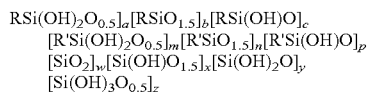

where R is independently methyl or optionally substituted or unsubstituted C2 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted carboxyl group, a substituted or unsubstituted (meth)acryl group a substituted or unsubstituted glycidylether group, or a combination thereof; R' is a fluorine substituted C3 alkyl group or optionally C4 to C10 alkyl group, a fluorine substituted C3 to C20 cycloalkyl group, a fluorine substituted C1 to C10 hydroxyalkyl group, a fluorine substituted aryl group, a fluorine substituted C2 to C20 heteroaryl group, a fluorine substituted C2 to C10 alkenyl group, a fluorine substituted carboxyl group, a fluorine substituted (meth)acryl group, a fluorine substituted glycidylether group, or a combination thereof; and 0<a,b,c,w,x,y,z<0.9, 0≤m,n,p<0.9, and a+b+c+m+n+p+w+x+y+z=1. The method also includes step of (ii) pretreating a sheet of cover-glass, (ii) coating the sheet of cover-glass with the coating composition on at least one surface selected from a front, a back and at least one edge of the sheet of cover glass to reduce the sheet resistance of the sheet of cover glass, (iii) heating the sheet of cover-glass to cure the coating; and (iv) assembling the photovoltaic solar module.

Another embodiment is q PID resistant photovoltaic solar module. The module includes a PID resistant photovoltaic solar module, the solar module including:

a front cover-glass with a coating, the coating comprising a combination of sols having a formula:

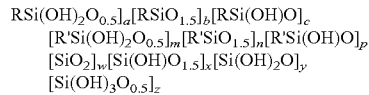

where R is independently methyl or optionally substituted or unsubstituted C2 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted carboxyl group, a substituted or unsubstituted (meth)acryl group a substituted or unsubstituted glycidylether group, or a combination thereof; R' is a fluorine substituted C3 alkyl group or optionally C4 to C10 alkyl group, a fluorine substituted C3 to C20 cycloalkyl group, a fluorine substituted C1 to C10 hydroxyalkyl group, a fluorine substituted aryl group, a fluorine substituted C2 to C20 heteroaryl group, a fluorine substituted C2 to C10 alkenyl group, a fluorine substituted carboxyl group, a fluorine substituted (meth)acryl group, a fluorine substituted glycidylether group, or a combination thereof; and 0<a,b,c,w,x,y,z<0.9, 0≤m,n,p<0.9, and a+b+c+m+n+p+w+x+y+z=1. The module also includes at least one photovoltaic solar cell with at least one layer of encapsulant disposed on a surface of the photovoltaic solar cell and a back cover-sheet, wherein the front cover-glass with the coating has an anti-reflective property, a hydrophobic property and an enhanced ion-migration blocking property when compared to the same front cover-glass without the coating and wherein the front cover-glass is coated on at least one surface selected from a front, a back and at least one edge These and other systems, methods, objects, features, and advantages of the present disclosure will be apparent to those skilled in the art from the following detailed description of the preferred embodiment and the drawings.

All documents mentioned herein are hereby incorporated in their entirety by reference. References to items in the singular should be understood to include items in the plural, and vice versa, unless explicitly stated otherwise or clear from the text. Grammatical conjunctions are intended to express any and all disjunctive and conjunctive combinations of conjoined clauses, sentences, words, and the like, unless otherwise stated or clear from the context.

DETAILED DESCRIPTION

Figure 1:
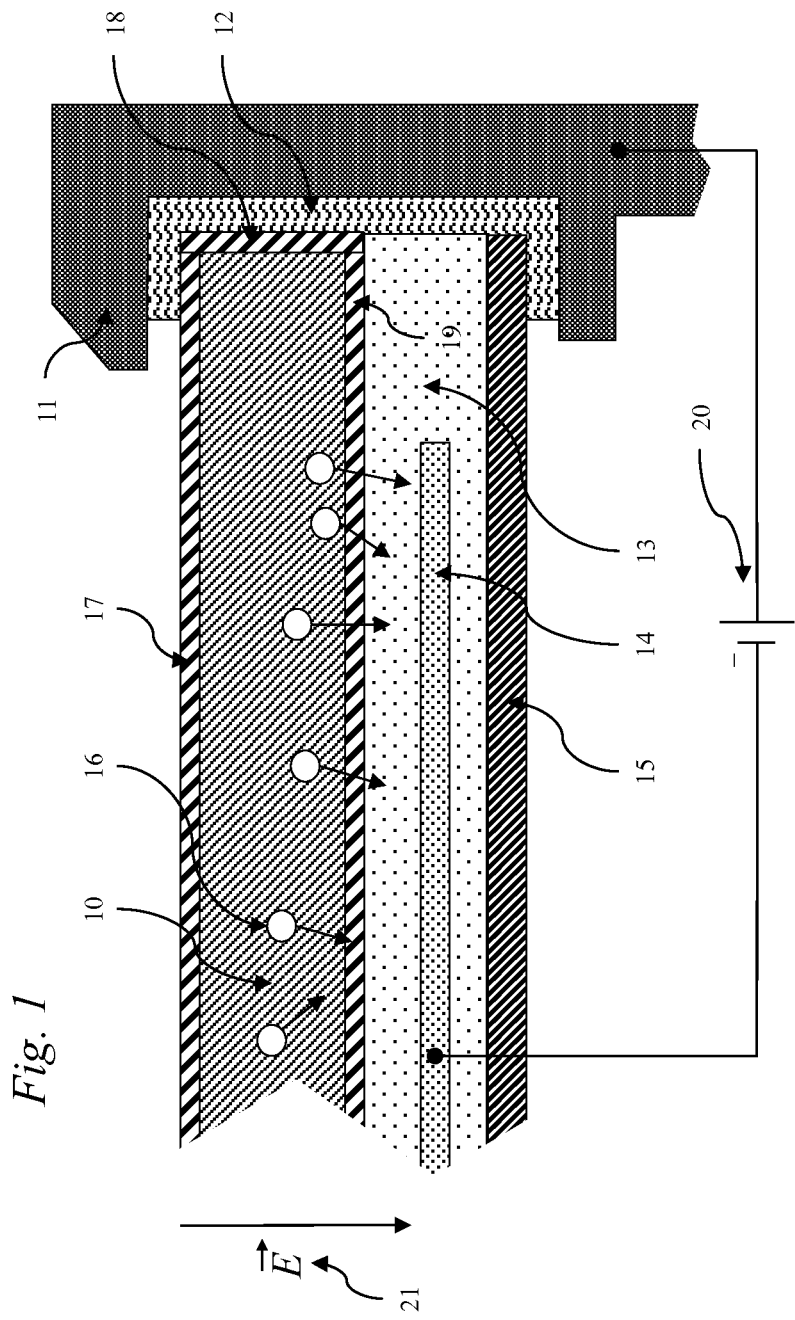
FIG. 1 shows a cross-section schematic view of part of a PV solar module.

FIG. 1 shows a cross-sectional view through a typical PV solar module. The front side of the module also known as the "sunny" side is at the top of the figure and the back side is at the bottom of the figure. The module is constructed as a stack of layers starting with the cover glass 10, encapsulating material 13, PV solar cell 14 and back-sheet 15. The edges of the module may be contained within a metal frame 11 adhered with a layer of silicone sealant, butyl rubber or composite tape 12. Encapsulating material or encapsulant 13 may include one or more layers of encapsulant as needed and as described herein as one layer, or two layers, or more.

During operation, that is when the PV solar module is illuminated by the sun, a high voltage 20 of up to 1500V DC may be maintained between the PV solar cell 14 and the frame 11. This creates a strong and constant electrical field 21 through the PV solar module. This constant electrical field provides a motive force for ions 16 within the cover glass to move towards the PV solar cell 14. It is believed that these ions are a prime cause of PID when they reach the PV solar cell 14 and interact with it.

In embodiments a coating 17 may be applied to the outside surface of the cover glass 10, or a coating 18 may be applied to the edge surface of the cover glass 10, or a coating 19 may be applied to the inside surface of the cover glass 10 or these coatings 17, 18 and 19 may be applied in any combination, for example just coating 17, or just coatings 17 and 19 or just coatings 18 and 19 etc.

Turning now to how the coatings may be used to reduce or eliminate PID, it has been shown in studies that increased conductivity on the front surface of the cover glass 10 may contribute to PID. Typically clean dry glass has low conductivity, however the presence of water, especially contaminated with dirt, dust and dissolved or deposited salts may increase the conductivity on the surface of glass and/or reduce the surface resistivity of the glass. Therefore, a coating 17 for the outside cover glass surface that reduces the amount of dirt, dust or salt build-up on the surface or that prevents moisture from adhering to the surface could also be advantageous in reducing PID. Additionally the coating could be further advantageous if it exhibited a high surface resistivity when compared to low-iron soda-lime glass. A coating with hydrophobic, super-hydrophobic and or oleophobic properties could be used to provide such functionality. Hard, durable coatings with these properties can be made according to the methods of this disclosure by selecting silane precursors that incorporate organic R groups such as alkyl, phenyl, aliphatic saturated organic groups such as methyl, ethyl, propyl, butyl, pentyl, hexyl, cyclohexyl. These may also include aliphatically unsaturated organic groups such as vinyl, allyl, butenyl, pentenyl, hexenyl, and ethynyl, propynyl, butynyl. The organic R group may include an aromatic group. The aromatic group can be selected from among groups such as phenyl, benzyl, xylyl, styryl, naphthyl, 1-phenylethyl, tolyl, ethylbenzyl and 2-phenylethyl to create persistent hydrophobic coatings. Selecting silane precursors with fluoro-carbon groups 3,3,3-trifluoropropyl, fluoromethyl, 2-fluoropropyl, 4,4,4-trifluoropropyl, 4,4,4,3,3-pentafluorobutyl, 5,5,5,4,4,3,3-heptafluoropentyl, 6,6,6,65,5,4,4,3,3-nanofluorohexyl, and 8,8,8,7,7-petafluorooctyl can be used to add an oleophobic property. Additives such as colloidal silica, carbon nanotubes, Buckminsterfullerene $C_{60}$ and $C_{70}$, could be used to engineer specific surface texture, which can further increase the hydrophobic property. In general the lower the surface energy of the coating, the more hydrophobic it is, and consequently it will also lower the surface resistivity of coated cover glass 10.

It is believed that the interaction of water with the surface of the glass, possibly enhanced by the presence of acids such as acetic acid derived from the encapsulant EVA on the inside of the cover glass 10 or carbonic or sulfuric acids generated from atmospheric $CO_2$ and $SO_2$, or enhanced by deposited sea salts on the outside, may contribute to the mobility and leaching of alkali metallic ions 16 such as sodium ions and the like from within the cover glass 10. Therefore a coating that eliminates or reduces the contact between water and the surface of the cover glass 10 could be advantageous in reducing PID. A hard, dense, non-porous or minimally porous coating further enhanced by a hydrophobic property could be used to provide this functionality. As water may more readily move through the PV solar module back-sheet 15 it can come in contact with the inside surface and edges of the cover glass 10. Therefore this coating could be applied to all or just selected surfaces of the cover glass 10. Coatings with these properties can be made according to this disclosure by selection of silane precursors with small or no organic R groups and by addition of crosslinking within the material to increase density. This can be achieved by selecting precursors with high silanol functionalities. Density can further be increased by heat treatment at temperatures between about 100° C. to about 300° C. and between about 100° C. and about 500° C. and between about 100° C. and about 700° C. and under a commercial glass tempering process.

Hard dense coatings may also act as a simple barrier to ion mobility. The barrier property of the coating can be increased by adding a function to capture or chelate alkali metal ions within the coating and prevent their further migration. The coating materials of the present disclosure may include ionic exchange resins such as polystyrene sulfonate, sulfonated polyphosphazene or other sulfonated polymers or chelating compounds such as thiol containing or quadridentatate schiff base ligands that have a strong affinity for ions and capture them in the coating or retard their mobility through the coating over the useful life of the PV solar module.

The motive force for the ions is the electrical field developed between the grounded frame 11 and the PV solar cell 14. During operation when the PV solar module is illuminated, a potential difference up to 1500V DC 20 may exist between the PV solar cell 14 and ground. In general, the outside surface of the cover glass 10 will be at a potential close to that of the frame and close to the ground potential. Therefore the electrical field 21 extends through the cover glass 10 to the PV solar cell 14. Alkali and alkaline-earth metal ions within the glass such as $Na^+$, $Mg^{++}$ and $Ca^{++}$ are exposed to this field and over time can be moved through and out of the cover glass 10 and through the encapsulating material 13 or encapsulant to the PV solar cell 14 wherein they contribute to or cause PID. If the electrical field 21 could be removed from the cover glass 10, the prime motive force for the ions would be eliminated, so greatly reducing the number of ions that could enter the encapsulant material 13 and eventually be transported to the PV solar cell 14. Therefore, a coating 17, 18 and 19 applied to the cover glass 10, such that the electrical potential is close to equal on both outside and inside of the cover glass 10 would eliminate the electrical field 21 across the thickness of the cover glass 10. Such a coating could be made according to this disclosure by making the electrical resistivity of the coating low in comparison to the resistivity of the cover glass 10. The resistivity of the coating may be reduced by selection of precursor chemicals to include other non-alkali metal oxides in addition to or in replacement of silicon in the final coating. For example, coatings with additives of $SnO_2$, $Al_2O_3$, $Si_3N_4$, $ZrO_2$, $HfO_2$ and $Ce_2O_3$, and similar, act to increase the conductivity and reduce the resistivity of the coating to less than about $10^{10} \Omega/\square$ sheet resistance. These additives may be in the form of a fine powder, such as nanoparticles, added in small quantities. Additionally, conductive carbon nanotubes (CNT) or silver nanowires could be dispersed in the liquid coating material to control the sheet resistance.

The coatings 17 and 19 of the present disclosure on the outside and inside of the cover glass 10, respectively comprise part of the optical path from the sun to the PV solar cell 14. Therefore their optical characteristics affect the transmission of light on that optical path. For coating 17 on the outside of the glass 10 it is desirable to have a refractive index (RI) over the wavelength range 350 nm to 1100 nm that is between about 1.52 and about 1.24, and between about 1.4 and about 1.3. It is also desirable to have a final cured coating thickness of between about 50 nm to about 250 nm, and about 100 nm to about 150 nm, and 120 nm±15 nm. These RI and thickness values may be optimized for light transmission through the cover glass 10 and to minimize reflection of the solar spectrum off the outside surface of the cover glass 10.

For coating 19 on the inside of the cover glass 10 it is desirable to have an RI over the wavelength range 350 nm to 1100 nm that matches the RI of the cover glass 10 and the encapsulant material 13 over the same wavelength range. If there is a difference in RI between the cover glass 10 and the encapsulant material 13, then it is desirable for the coating 19 to have a value close to that calculated by the following formula, where n is the RI of the coating 19, $n_1$ is the RI of the cover glass 10 and $n_2$ is the RI of the encapsulant material 13.

$$n=\sqrt{n_1 n_2}$$

The RI of the coating material 19 may be between about 1.52 and about 1.45 and between about 1.52 and about 1.48 and 1.52±0.02. The thickness of coating 19 may be between about 50 nm and about 10 µm, and between about 100 nm and about 250 nm, and between about 500 nm and about 5 µm, and between about 1 µm and about 10 µm.

The RI of the coatings in the present disclosure may be tuned. Taking the base RI of a pure silica coating at about 1.45, then RI may be reduced by increasing the porosity of the material. Porosity may be increased by the selection of silane precursor chemicals that include organic groups which affect the way in which the silica network forms; coatings may be formed with nanoparticles either synthesized directly or added during formulation; porogen materials may be included that are burned off during a heat treatment step leaving behind pores in the formed coating. Suitable porogens include PEO, PPO, diethylene oxide, dipropylene oxide, PEG 100, 200, 300, 400, 600, Tween 20 and Tween 80. The RI of the coatings may be increased by the addition of metal oxide (e.g., ceramic) nanoparticles such as $TiO_2$, $SnO_2$, $Al_2O_3$, $Si_3N_4$, $ZrO_2$, $HfO_2$, $Ce_2O_3$ and the like.

Another consideration for coatings 19 on the inside of the cover glass 10 is adhesion between the coating 19 and the cover glass 10 and between the coating 19 and the encapsulant material 13. Materials that may be included in the coating formulation that promote adhesion to the encapsulant materials include metharyloxypropyl-, glycidyloxypropyl- and methacrylamino propyl-trialkoxy silane.

In general, multiple steps may be used to apply the coating sol to a given substrate, such as for example, three steps. First, the substrate may be cleaned and pretreated. Second, the substrate may be coated with the sol or mixture of sols. Third, the final coating may be formed on the substrate.

As an initial step, the substrate may be pretreated or pre-cleaned to remove surface impurities and to activate the surface by generating a fresh surface or new binding sites on the surface. It is desirable to increase the surface energy of the substrate through pretreatment or cleaning of the substrate surface to form an "activated" surface. For example an activated surface may be one with many exposed Si—OH moieties. An activated surface reduces the contact angle of the substrate and enables effective wetting of the sol on the surface. In some embodiments, a combination of physical polishing or cleaning and/or chemical etching may be sufficient to provide even wetting of the sol. In cases, where the surface tension would need to be further lowered, the substrate, may be pretreated with a dilute surfactant solution (low molecular weight surfactants such as surfynol; long chain alcohols such as hexanol or octanol; low molecular weight ethylene oxide or propylene oxide; or a commercial dishwasher detergent such as CASCADE, FINISH, or ELECTRASOL to further help the sol spread better on the glass surface.

Accordingly, surface pretreatment may involve a combination of chemical and physical treatments of the surface. The chemical treatment steps may include (1) cleaning the surface with a solvent or combination of solvents, detergents, mild bases like sodium carbonate or ammonium carbonate and/or (2) cleaning the surface with a solvent along with an abrasive pad, (3) optionally chemically etching the surface, and/or (4) washing the surface with water. The physical treatment steps may include (1) cleaning the surface with a solvent or combination of solvents, (2) cleaning the surface with a solvent along with particulate abrasives, and (3) washing the surface with water. It should be appreciated that a substrate can be pretreated by using only the chemical treatment steps or only the physical treatment steps. Alternatively, both chemical and physical treatment steps could be used in any combination. It should be further appreciated that the physical cleaning action of friction between a cleaning brush or pad and the surface is an important aspect of the surface preparation.

In the first chemical treatment step, the surface may be treated with a solvent or combination of solvents with variable hydrophobicity. Typical solvents used are water, ethanol, isopropanol, acetone, and methyl ethyl ketone. A commercial glass cleaner (e.g., WINDEX) can also be employed for this purposes. The surface may be treated with an individual solvent separately or by using a mixture of solvents. In the second step, an abrasive pad (e.g., SCOTCHBRITE) may be rubbed over the surface with the use of a solvent, noting that this may be performed in conjunction with the first step or separately after the first step. In the last step, the surface may be washed or rinsed with water and dried.

One example of substrate preparation by this method involves cleaning the surface with an organic solvent such as ethanol, isopropanol, or acetone to remove organic surface impurities, dirt, dust, and/or grease (with or without an abrasive pad) followed by cleaning the surface with water. Another example involves cleaning the surface with methyl ethyl ketone (with or without an abrasive pad) followed by washing the surface with water. Another example is based on using a 1:1 mixture of ethanol and acetone to remove organic impurities followed by washing the surface with water.

In some instances an additional, optional step of chemically treating the surface with concentrated nitric acid, sulfuric acid, or piranha solution (a 1:1 mixture of 96% sulfuric acid and 30% $H_2O_2$, hydrogen peroxide) may be done to make the surface suitable for bonding to the deposited sol. Typically this step would be performed prior to the last step of rinsing the surface with water. In one embodiment, the substrate may be placed in piranha solution for 20 minutes followed by soaking in deionized water for 5 minutes. The substrate may then be transferred to another container holding fresh deionized water and soaked for another 5 minutes. Finally, the substrate may be rinsed with deionized water and air-dried.

The substrate may be alternatively or additionally prepared by physical treatment. In the physical treatment case, for one embodiment the surface may be simply cleaned with a solvent and the mechanical action of a cleaning brush or pad, optionally a surfactant or detergent can be added to the solvent, after which the substrate is rinsed with water and air dried. In another embodiment the surface may be first cleaned with water followed by addition of powdered abrasive particles such as ceria, titania, zirconia, alumina, aluminum silicate, silica, magnesium hydroxide, aluminum hydroxide particles, silicon nitride, silicon carbide, or combinations thereof onto the surface of the substrate to form a slurry or paste on the surface. The abrasive media can be in the form a powder or it can be in the form of slurry, dispersion, suspension, emulsion, or paste. The particle size of the abrasives can vary from 0.1 to 10 microns and in some embodiments from 1 to 5 microns. The substrate may be polished with the abrasive slurry via rubbing with a pad (e.g., a SCOTCHBRITE pad), a cloth, a foam, or paper pad. Alternatively, the substrate may be polished by placement on the rotating disc of a polisher followed by application of abrasive slurry on the surface and rubbing with a pad as the substrate rotates on the disc. Another alternative method involves use of an electric polisher that can be used as a rubbing pad in combination with abrasive slurry to polish the surface. The substrates polished with the slurry may be cleaned by water and air-dried.

After pretreating the surface, the coating may be deposited on a substrate by techniques known in the art, including dip coating, spray coating, flow coating, roll coating or slot-die coating to form a uniform coating on the substrate. Other methods for deposition that can be used include spin-coating; aerosol deposition; ultrasound, heat, or electrical deposition means; micro-deposition techniques such as ink-jet, spay-jet, xerography; or commercial printing techniques such as silk printing, dot matrix printing, etc. Deposition of the sol may be done under ambient conditions or under controlled temperature and humidity conditions. In some embodiments the temperature is controlled between 20° C. and 35° C. and/or the relative humidity is controlled between 20% and 60% or more preferably between 25% and 35%.

In some embodiments, the sol may be deposited by flow coating wherein the sol is dispensed from a single nozzle onto a moving substrate at a rate such that the flowing sol leads to a uniform deposition onto a surface or from multiple nozzles onto a stationary surface or from a slot onto a stationary surface. Another method of deposition is via depositing the liquid sol onto a substrate followed by use of a mechanical dispersant to spread the liquid evenly onto a substrate. For example, a squeegee or other mechanical device having a sharp, well-defined, uniform edge may be used to spread the sol such as roll coating.

The thickness of the coating mixture as deposited may be affected by the coating method, as well as by the viscosity of the coating mixture. Accordingly, the coating method should be selected so that the desired coating thickness is achieved for any given coating mixture. For the flow coating method the critical parameter for controlling average thickness may be the non-volatile solids content of the coating material. For the roll-coating method the critical parameters may be the non-volatile solids content of the coating material, the speed of the substrate being coated and the speed and pressure of the rollers. In embodiments of the disclosure the non-volatile solids content of the coating material may be between about 0.5 wt % and about 10 wt %, and between about 0.8 wt % and about 5 wt %, and between about 1.4 wt % and about 3 wt %. In embodiments that use a reverse roll-coating method the speed of the substrate may be between about 2 m/minute and about 12 m/minute, and between about 3 m/minute and about 8 m/minute. The speed of the application roller can be considered as a ratio to the substrate speed such that a substrate:roller ratio of about 0.1 to about 2.00, and about 0.75 to about 1.25 may be maintained. The offset between the doctor roller and the application roller may be between about −0.05 mm and about −0.5 mm and the offset between the scraper roller and the application roller may be between about 0 mm and about −0.5 mm. The offset between the application roller and the substrate surface may be between about −0.01 mm and −0.50 mm. The hardness of the application roller is between about 25 Shore and about 50 Shore and between about 30 Shore and 40 Shore, all measured on the Shore A scale.

There are several methods by which the coating may be dried and cured and/or aged to form the final coating. In some embodiments the coating may be dried and cured under ambient or room temperature conditions. In some embodiments, the coating may be dried by a flash-off oven either by blowing hot air across the surface or by the application of infrared heat. The substrate surface may be heated to a temperature of between about 100° C. and about 300° C. and between about 150° C. and about 250° C. for a time of between about 20 seconds and 10 minutes and between about 1 minute and 5 minutes. Whether dried under ambient conditions or by flash-off the coating may be cured by heating in an oven at a temperature of between about 100° C. and about 500° C. and between about 120° C. and about 300° C. and between about 200° C. and 300° C. for a dwell time of between about 5 minutes and about 60 minutes and between about 15 minutes and 30 minutes. In general, lower cure temperatures require longer cure times. Maximum cure temperature may be determined by the desired coating hardness, higher temperatures will generate harder coatings and by limitations imposed by the substrate such as not affecting the temper of the glass substrate. In some embodiments the coating may be cured during a standard glass tempering process.

General procedure for sol preparation is described in the following examples. These examples should not be viewed as limiting.

In an embodiment referred to as Example 1, Sol I was prepared by charging a 500 mL flask with 177 g of IPA and 25 g of 0.04 M HCl. After stirring at 100 rpm at room temperature for about 1 minute, 2.87 g (0.021 moles) of methyltrimethoxysilane was added to the mixture. The mixture was stirred at room temperature for about 30 minutes. Sol II was prepared by charging a 500 mL flask with 177 g of IPA and 25 g of 0.04 M HCl. After stirring at 100 rpm at room temperature for about 1 minute, 3.71 g (0.021 moles) of (3,3,3-trifluoropropyl)-trimethoxysilane was added to the mixture. The mixture was stirred at room temperature for about 30 minutes. Sol I and II were mixed together followed by addition of 6.39 g (0.042 moles) of tetramethoxysilane. The final mixture was stirred at room temperature for about 30 minutes. This mixture was allowed to age under ambient conditions for 24 hours up to 120 hours.

In an embodiment referred to as Example 2, Sol I was prepared by charging a 500 mL flask with 177 g of IPA and 25 g of 0.04 M HCl. After stirring at 100 rpm at room temperature for about 1 minute, 2.87 g (0.021 moles) of methyltrimethoxysilane was added to the mixture. The mixture was stirred at room temperature for about 30 minutes. Sol II was prepared by charging a 500 mL flask with 177 g of IPA and 25 g of 0.04 M HCl. After stirring at 100 rpm at room temperature for about 1 minute, 3.71 g (0.021 moles) of (3,3,3-trifluoropropyl)-trimethoxysilane was added to the mixture. The mixture was stirred at room temperature for about 30 minutes. Sol I and II were mixed together followed by addition of 8.8 g (0.042 moles) of tetraethoxysilane. The final mixture was stirred at room temperature for about 30 minutes. This mixture was allowed to age under ambient conditions for 48 hours.

In an embodiment referred to as Example 3, sol was prepared by charging a 500 mL flask with 354 g of IPA and 50 g of 0.04 M HCl. After stirring at 100 rpm room temperature for about 1 minute, 4.37 g (0.0321 moles) of methyltrimethoxysilane was added to the mixture. The mixture was stirred at room temperature for about 30 minutes followed by addition of 7.08 g (0.034 moles) of tetraethoxysilane. The final mixture was stirred at room temperature for about 30 minutes. This mixture was allowed to age under ambient conditions for 48 hours.

In an embodiment referred to as Example 4, Sol I was prepared by charging a 500 mL flask with 177 g of IPA and 25 g of 0.04 M HCl. After stirring at 100 rpm at room temperature for about 1 minute, 2.63 g (0.0193 moles) of methyltrimethoxysilane was added to the mixture. The mixture was stirred at room temperature for about 30 minutes. Sol II was prepared by charging a 500 mL flask with 177 g of IPA and 25 g of 0.04 M HCl. After stirring at 100 rpm at room temperature for about 1 minute, 0.284 g (0.0013 moles) of (3,3,3-trifluoropropyl)-trimethoxysilane was added to the mixture. The mixture was stirred at room temperature for about 30 minutes. Sol I and II were mixed together followed by addition of 6.24 g (0.03 moles) of tetraethoxysilane. The final mixture was stirred at room temperature for about 30 minutes. This mixture was allowed to age under ambient conditions for 48 hours.

In an embodiment referred to as Example 5, Sol I was prepared by charging a 500 mL flask with 177 g of IPA and 25 g of 0.04 M HCl. After stirring at 100 rpm at room temperature for about 1 minute, 2.39 g (0.01753 moles) of methyltrimethoxysilane was added to the mixture. The mixture was stirred at room temperature for about 30 minutes. Sol II was prepared by charging a 500 mL flask with 177 g of IPA and 25 g of 0.04 M HCl. After stirring at 100 rpm at room temperature for about 1 minute, 0.399 g (0.00262 moles) of (3,3,3-trifluoropropyl)-trimethoxysilane was added to the mixture. The mixture was stirred at room temperature for about 30 minutes. Sol I and II were mixed together followed by addition of 6.24 g (0.03 moles) of tetraethoxysilane. The final mixture was stirred at room temperature for about 30 minutes. This mixture was allowed to age under ambient conditions for 48 hours.

In an embodiment referred to as Example 6, sol was prepared by charging a 500 mL flask with 345 g of IPA and 50 g of 0.08 M HCl. After stirring at 100 rpm at room temperature for about 1 minute, 9.13 g (0.067 moles) of methyltrimethoxysilane was added to the mixture. The mixture was stirred at room temperature for about 30 minutes followed by addition of 13.96 g (0.067 moles) of tetraethoxysilane. The final mixture was stirred at room temperature for about 30 minutes. This mixture was allowed to age under ambient conditions for 48 hours. 10.5 mL of 1-methoxy-2-propanol was added to the sol mixture and stirred for about 1 minute.

In an embodiment referred to as Example 7, sol was prepared by charging a 500 mL flask with 197 g of IPA and 140 g of 0.08 M HCl. After stirring at 100 rpm at room temperature for about 1 minute, 30.2 g (0.288) of methyltrimethoxysilane was added to the mixture. The mixture was stirred at room temperature for about 30 minutes followed by addition of 60 g (0.288 moles) of tetraethoxysilane. The final mixture was stirred at room temperature for about 30 minutes. This mixture was allowed to age under ambient conditions for 48 hours.

Figure 2:
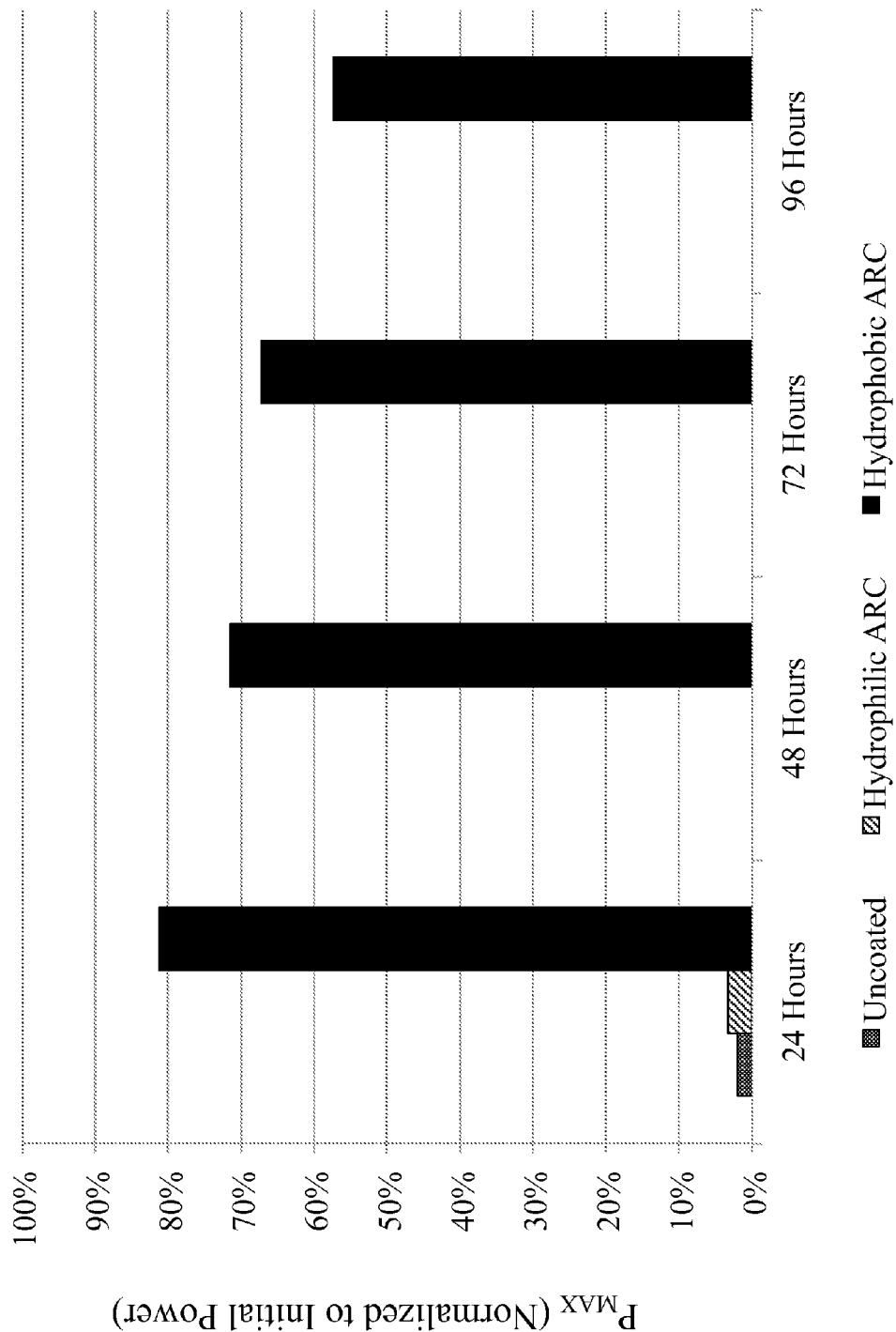
FIG. 2 shows experimental results demonstrating the enhanced PID resistance of a hydrophobic anti-reflection coating relative to a hydrophilic anti-reflection coating and no coating on the front-side of a PV solar module cover glass.

FIG. 2 shows experimental results demonstrating the enhanced PID resistance of a hydrophobic anti-reflection coating relative to a hydrophilic anti-reflection coating and no coating on the front-side of PV solar module cover glass. In this experiment coating material made according to Example 3 was used to roll-coat the front-side of two 30 cm×30 cm pieces of standard patterned low-iron soda-lime cover glass characteristic of glass used in the manufacture of crystalline silicon PV solar modules. The coating thickness was about 110 nm. The coating was cured at about 275° C. for 30 minutes. These samples were referred to as "Hydrophobic ARC". Two more 30 cm×30 cm pieces of the same glass were selected and labeled "Uncoated." Two 30 cm×30 cm pieces of a similar glass with a commercially available anti-reflection coating and with a water contact angle measured at <10° were labeled "Hydrophilic ARC". The six pieces of cover glass were assembled into single-cell mini-modules using standard commercially available EVA encapsulant and backsheet material. Specially prepared PID-prone 156 mm multi-crystalline silicon PV cells were used. The cells were positioned within the mini-module such that their top-left corner was spaced a distance of about 2.5 cm from the top-left corner of the cover glass. A strip of adhesive copper tape was affixed along the top edge of the cover glass. The six mini-modules were flash tested to measure their initial maximum power ($P_{MAX}$). They were then biased with a voltage of 1000 Vdc between the cell and the copper tape and placed into a temperature and humidity chamber under conditions of 85° C. and 85% RH. The mini-modules were removed and flash tested and $P_{MAX}$ was recorded at 24-hour, 48-hour, 72-hour and 96-hour read-points.

The results of the experiment show a very distinct enhancement of PID resistance for the mini-modules with Hydrophobic ARC coated cover glass. On average they retained nearly 60% of their initial power after 96 hours of stress, whereas the mini-modules with hydrophilic ARC coated cover glass and uncoated cover glass had lost essentially all power after 24 hours of stress.

Figure 3:
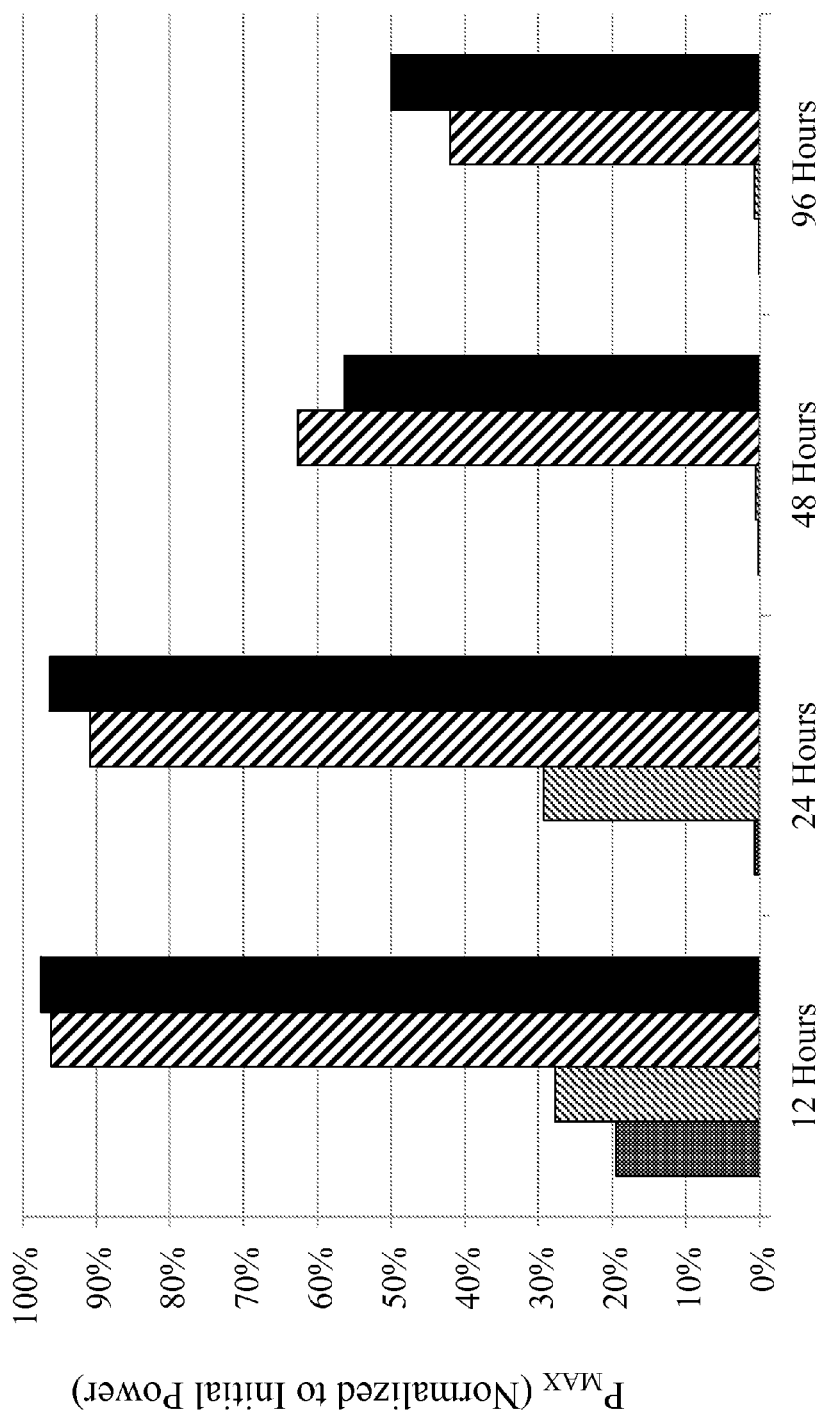
FIG. 3 shows experimental results demonstrating enhanced PID resistance of coatings on the back-side of the PV solar module cover glass relative to no coatings and just coatings on the front-side of the PV solar module cover glass.

FIG. 3 shows experimental results demonstrating enhanced PID resistance of coatings on the back-side of the PV solar module cover glass relative to no coatings and just coatings on the front-side of the PV solar module cover glass. In this experiment coating material made according to Example 3 was used to roll-coat six 20 cm×20 cm pieces of standard patterned low-iron soda-lime cover glass characteristic of glass used in the manufacture of crystalline silicon PV solar modules. The coating thickness was about 110 nm. The coating was cured at about 275° C. for 30 minutes. Of the six pieces, two were coated on the front-side (that is the side that typically faces the sun in a PV solar module); two were coated on the back-side and two were coated on both the front and back sides. Two more 20 cm×20 cm pieces of the same glass were selected and used as uncoated controls. The total of eight pieces of cover glass were assembled into single-cell mini-modules using standard commercially available EVA encapsulant and backsheet material. Specially prepared PID-prone 156 mm multi-crystalline silicon PV cells were used. The eight mini-modules were flash tested to measure their initial $P_{MAX}$. They were then biased with a voltage of 1000 Vdc between the cell and a sheet of aluminum foil that was placed over the front-side of the mini-module. They were then placed into a temperature and humidity chamber under conditions of 85° C. and 85% RH. The mini-modules were removed and flash tested and $P_{MAX}$ was recorded at 12-hour, 24-hour, 48-hour and 96-hour read-points.

The results of the experiment shows a very distinct enhancement of PID resistance for the mini-modules with coatings on the back-side and on both sides relative to mini-modules with no coating or with just a coating on the front-side. The mini-modules with coatings on both sides and just on the back-side behaved in a similar manner, retaining about 50% of their initial power after the full 96 hours of stress. The mini-module with just a front-side coating performed better than the uncoated mini-module, retaining about 30% of its initial power after 24 hours of stress whereas the uncoated mini-module had degraded to close to zero power at the same read-point. This experiment was conducted with an aluminum foil sheet completely covering the front-side of the cover glass. It is possible that the surface resistivity advantage of the hydrophobic coating over uncoated glass was masked by the low electrical resistance foil.

Coatings on glass to reduce the effects of PID as described herein may be employed to relax design and specification constraints on other components contained within the PV module to create a better cost and performance optimized module. For example, by providing an effective ion barrier, coated glass may allow the use of silicon nitride cell coatings with relaxed process requirements.

For "glass-glass" or bi-facial modules that utilize glass as the back-sheet material, embodiments with coatings on the interior and/or exterior surfaces of the glass back-sheet may be used to reduce the effects of PID in a manner that is analogous to those previously described for coating the front cover glass. References to coating on the inside or outside or interior or exterior have equal meaning regardless of whether the glass is on the front cover (sun facing) side of the PV module or on the backside and used as a back-sheet. References to the front of the cover glass are analogous to the back of the back-sheet and references to the back of the cover glass are analogous to the front of the back-glass.

Embodiments described herein are well suited to performing various other steps or variations of the steps recited herein, and in a sequence other than that depicted and/or described herein.

It should be appreciated that reference throughout this specification to "one embodiment" or "an embodiment" means that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the disclosure.

Similarly, it should be appreciated that in the foregoing description of exemplary embodiments of the disclosure, various features of the disclosure are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

While the disclosure has been disclosed in connection with the preferred embodiments shown and described in detail, various modifications and improvements thereon will become readily apparent to those skilled in the art. Accordingly, the spirit and scope of the present disclosure is not to be limited by the foregoing examples, but is to be understood in the broadest sense allowable by law. The use of the terms "a" and "an" and "the" and similar referents in the context of describing the disclosure (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above described embodiment, method, and examples, but by all embodiments and methods within the scope and spirit of the disclosure.

All documents referenced herein are hereby incorporated by reference.

What is claimed is:

1. A PID resistant photovoltaic solar module, comprising:
a front cover-glass with a coating, wherein the coating includes a nanoparticle additive selected from the group consisting of $SnO_2$, $Al_2O_3$, $Si_3N_4$, $ZrO_2$, $HfO_2$ and $Ce_2O_3$;
a first layer of encapsulant;
at least one photovoltaic solar cell;
a second layer of encapsulant; and
a back cover-sheet,
wherein the front cover-glass with the coating has an anti-reflective property, a hydrophobic property and an enhanced ion-migration blocking property when compared to the same front cover-glass without the coating; and
wherein the front cover-glass is coated on at least one surface selected from the surfaces consisting of: a front surface, a back surface, and at least one edge surface.

2. The solar module of claim 1 wherein, the front cover-glass front-side coating has a refractive index and a thickness selected from the group consisting of: i) the refractive index between 1.52 and 1.25 and the thickness of between 50 nm and 250 nm; and ii) the refractive index between 1.52 and 1.45 and the thickness of between 50 nm and 10 μm.

3. The solar module of claim 1 wherein a sheet resistance of the front cover-glass coating is less than $10^{10} \Omega/\square$ and at least the front and back surfaces of the front cover glass are coated and all coated surfaces are electrically connected.

4. The solar module of claim 1 wherein a sheet resistance of the front cover-glass coating is higher than the sheet resistance of the equivalent front cover-glass that is uncoated.

5. The solar module of claim 1 wherein the front cover-glass further has an oleophobic property.

6. The solar module of claim 1, wherein the coating comprises a coating composition of a combination of sols having a formula:

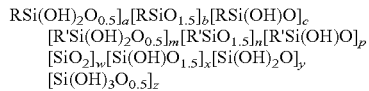
$[R'Si(OH)_2O_{0.5}]_m[R'SiO_{1.5}]_n[R'Si(OH)O]_p$
$[SiO_2]_w[Si(OH)O_{1.5}]_x[Si(OH)_2O]_y$
$[Si(OH)_3O_{0.5}]_z$ where R is independently methyl or optionally a substituted or unsubstituted C2 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted carboxyl group, a substituted or unsubstituted (meth)acryl group a substituted or unsubstituted glycidylether group, or a combination thereof;

where R' is a fluorine substituted C3 alkyl group or optionally C4 to C10 alkyl group, a fluorine substituted C3 to C20 cycloalkyl group, a fluorine substituted C1 to C10 hydroxyalkyl group, a fluorine substituted aryl group, a fluorine substituted C2 to C20 heteroaryl group, a fluorine substituted C2 to C10 alkenyl group, a fluorine substituted carboxyl group, a fluorine substituted (meth)acryl group, a fluorine substituted glycidylether group, or a combination thereof; and $0<a,b,c,w,x,y,z<0.9$, $0\leq m,n,p<0.9$, and $a+b+c+m+n+p+w+x+y+z=1$.

7. The solar module of claim 6, wherein the coating is prepared from at least two sols and wherein the at least two sols are separately hydrolyzed before preparing the coating.

8. The solar module of claim 6, wherein the front cover-glass is a pre-treated front cover glass before the coating is applied.

9. The solar module of claim 8, wherein the pre-treated front cover-glass is pretreated by a physical pretreatment or a chemical pretreatment before the coating is applied.

10. A PID resistant photovoltaic solar module, comprising:
a front cover-glass with a coating, wherein the coating comprises at least one of conductive carbon nanotubes (CNT) or silver nanowires dispersed within the coating;
a first layer of encapsulant;
at least one photovoltaic solar cell;
a second layer of encapsulant; and
a back cover-sheet,
wherein the front cover-glass with the coating has an anti-reflective property, a hydrophobic property and an enhanced ion-migration blocking property when compared to the same front cover-glass without the coating; and
wherein the front cover-glass is coated on at least one surface selected from the surfaces consisting of: a front surface, a back surface, and at least one edge surface.

11. The solar module of claim 10, wherein the front cover-glass front-side coating has a refractive index and a thickness selected from the group consisting of: i) the refractive index between 1.52 and 1.25 and the thickness of between 50 nm and 250 nm; and ii) the refractive index between 1.52 and 1.45 and the thickness of between 50 nm and 10 μm.

12. The solar module of claim 10, wherein the coating comprises a coating composition of a combination of sols having a formula:

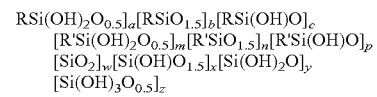
$[R'Si(OH)_2O_{0.5}]_m[R'SiO_{1.5}]_n[R'Si(OH)O]_p$
$[SiO_2]_w[Si(OH)O_{1.5}]_x[Si(OH)_2O]_y$
$[Si(OH)_3O_{0.5}]_z$ where R is independently methyl or optionally substituted or unsubstituted C2 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted carboxyl group, a substituted or unsubstituted (meth)acryl group, a substituted or unsubstituted glycidylether group, or a combination thereof;

where R' is a fluorine substituted C3 alkyl group or optionally C4 to C10 alkyl group, a fluorine substituted C3 to C20 cycloalkyl group, a fluorine substituted C1 to C10 hydroxyalkyl group, a fluorine substituted aryl group, a fluorine substituted C2 to C20 heteroaryl group, a fluorine substituted C2 to C10 alkenyl group, a fluorine substituted carboxyl group, a fluorine substituted (meth)acryl group, a fluorine substituted glycidylether group, or a combination thereof; and $0<a,b,c,w,x,y,z<0.9$, $0\leq m,n,p<0.9$, and $a+b+c+m+n+p+w+x+y+z=1$.

13. The solar module of claim 12, wherein the coating is prepared from at least two sols and wherein the at least two sols are separately hydrolyzed before preparing the coating.

14. A method of manufacturing a PID resistant photovoltaic solar module by:
(i) preparing a coating composition that contains a combination of sols having a formula:

$$RSi(OH)_2O_{0.5}]_a[RSiO_{1.5}]_b[RSi(OH)O]_c[R'Si(OH)_2O_{0.5}]_m[R'SiO_{1.5}]_n[R'Si(OH)O]_p[SiO_2]_w[Si(OH)O_{1.5}]_x[Si(OH)_2O]_y[Si(OH)_3O_{0.5}]_z,$$

wherein the coating composition comprises at least one of conductive carbon nanotubes (CNT) or silver nanowires dispersed within the coating composition;
where R is independently methyl or optionally a substituted or unsubstituted C2 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted carboxyl group, a substituted or unsubstituted (meth)acryl group, a substituted or unsubstituted glycidylether group, or a combination thereof;
where R' is a fluorine substituted C3 alkyl group or optionally C4 to C10 alkyl group, a fluorine substituted C3 to C20 cycloalkyl group, a fluorine substituted C1 to C10 hydroxyalkyl group, a fluorine substituted aryl group, a fluorine substituted C2 to C20 heteroaryl group, a fluorine substituted C2 to C10 alkenyl group, a fluorine substituted carboxyl group, a fluorine substituted (meth)acryl group, a fluorine substituted glycidylether group, or a combination thereof; and $0<a,b,c,w,x,y,z<0.9$, $0\leq m,n,p<0.9$, and $a+b+c+m+n+p+w+x+y+z=1$;
(ii) pretreating a sheet of cover-glass;
(ii) coating the sheet of cover-glass with the coating composition on at least one surface selected from a front, a back and at least one edge of the sheet of cover glass;
(iii) heating the sheet of cover-glass to cure the coating; and
(iv) assembling the photovoltaic solar module.

15. The method of claim 14, further comprising pretreating the sheet of cover glass by washing with water.

16. The method of claim 14 wherein the sheet of cover-glass is coated by roll-coating.

17. The method of claim 14 wherein, the sheet of cover-glass is heated by heating to a temperature between 100° C. and 500° C.

18. The method of claim 14, wherein the step of preparing further comprises separately hydrolyzing at least two of the sols before preparing the combination coating.

19. The method of claim 14, further comprising pretreating the front cover glass by a physical pretreatment or a chemical pretreatment before the coating is applied.

20. The method of claim 14, further comprising disposing a layer of encapsulant on a photovoltaic solar cell of the photovoltaic solar module.

21. A method of manufacturing a PID resistant photovoltaic solar module by:
(i) preparing a coating composition that contains a combination of sols having a formula:

$$RSi(OH)_2O_{0.5}]_a[RSiO_{1.5}]_b[RSi(OH)O]_c[R'Si(OH)_2O_{0.5}]_m[R'SiO_{1.5}]_n[R'Si(OH)O]_p[SiO_2]_w[Si(OH)O_{1.5}]_x[Si(OH)_2O]_y[Si(OH)_3O_{0.5}]_z;$$

where R is independently methyl or optionally a substituted or unsubstituted C2 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted carboxyl group, a substituted or unsubstituted (meth)acryl group, a substituted or unsubstituted glycidylether group, or a combination thereof;
where R' is a fluorine substituted C3 alkyl group or optionally C4 to C10 alkyl group, a fluorine substituted C3 to C20 cycloalkyl group, a fluorine substituted C1 to C10 hydroxyalkyl group, a fluorine substituted aryl group, a fluorine substituted C2 to C20 heteroaryl group, a fluorine substituted C2 to C10 alkenyl group, a fluorine substituted carboxyl group, a fluorine substituted (meth)acryl group, a fluorine substituted glycidylether group, or a combination thereof; and $0<a,b,c,w,x,y,z<0.9$, $0\leq m,n,p<0.9$, and $a+b+c+m+n+p+w+x+y+z=1$;
(ii) pretreating a sheet of cover-glass;
(ii) coating the sheet of cover-glass with the coating composition on at least one surface selected from a front, a back and at least one edge of the sheet of cover glass;
(iii) heating the sheet of cover-glass to cure the coating; and
(iv) assembling the photovoltaic solar module;
wherein the coating composition comprises at least one additive selected from the group consisting of $SnO_2$, $Al_2O_3$, $ZrO_2$, $Si_3N_4$, $HfO_2$ and $Ce_2O_3$, wherein a sheet resistance of the sheet of cover glass is reduced when compared to an uncoated sheet resistance of a sheet of cover glass, wherein the additive is in the form of nanoparticles.

22. A PID resistant photovoltaic solar module, comprising:
a front cover-glass with a coating, wherein the coating comprises at least one of conductive carbon nanotubes (CNT) or silver nanowires dispersed within the coating composition, the coating comprising a combination of sols having a formula:

$$RSi(OH)_2O_{0.5}]_a[RSiO_{1.5}]_b[RSi(OH)O]_c[R'Si(OH)_2O_{0.5}]_m[R'SiO_{1.5}]_n[R'Si(OH)O]_p[SiO_2]_w[Si(OH)O_{1.5}]_x[Si(OH)_2O]_y[Si(OH)_3O_{0.5}]_z$$

where R is independently methyl or optionally substituted or unsubstituted C2 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted carboxyl group, a substituted or unsubstituted (meth)acryl group, a substituted or unsubstituted glycidylether group, or a combination thereof;
where R' is a fluorine substituted C3 alkyl group or optionally C4 to C10 alkyl group, a fluorine substituted C3 to C20 cycloalkyl group, a fluorine substituted C1 to C10 hydroxyalkyl group, a fluorine substituted aryl group, a fluorine substituted C2 to C20 heteroaryl group, a fluorine substituted C2 to C10 alkenyl group, a fluorine substituted carboxyl group, a fluorine substituted (meth)acryl group, a fluorine substituted glycidylether group, or a combination thereof; and $0<a,b,c,w,x,y,z<0.9$, $0\leq m,n,p<0.9$, and $a+b+c+m+n+p+w+x+y+z=1$;

at least one photovoltaic solar cell with at least one layer of encapsulant disposed on a surface of the photovoltaic solar cell; and a back cover-sheet, wherein the front cover-glass with the coating has an anti-reflective property, a hydrophobic property and an enhanced ion-migration blocking property when compared to the same front cover-glass without the coating; and wherein the front cover-glass is coated on at least one surface selected from the surfaces consisting of: a front surface, a back surface, and at least one edge surface.

23. The solar module of claim 22, the coating further comprising an additive selected from the group consisting of $SnO_2$, $Al_2O_3$, $ZrO_2$, $HfO_2$, $Si_3N_4$, and $Ce_2O_3$, wherein a sheet resistance of the front cover glass is reduced when compared to an uncoated sheet resistance of the front cover glass.

24. The solar module of claim 22, wherein the at least one layer of encapsulant comprises two layers of encapsulant.

25. A PID resistant photovoltaic solar module, comprising:

a front cover-glass with a coating, the coating comprising a nanoparticle additive comprising a metallic oxide, nitride or carbide, and the coating further comprising a combination of sols having a formula:

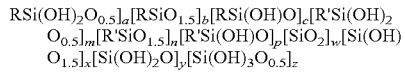

where R is independently methyl or optionally a substituted or unsubstituted C2 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted carboxyl group, a substituted or unsubstituted (meth)acryl group, a substituted or unsubstituted glycidylether group, or a combination thereof;

where R' is a fluorine substituted C3 alkyl group or optionally C4 to C10 alkyl group, a fluorine substituted C3 to C20 cycloalkyl group, a fluorine substituted C1 to C10 hydroxyalkyl group, a fluorine substituted aryl group, a fluorine substituted C2 to C20 heteroaryl group, a fluorine substituted C2 to C10 alkenyl group, a fluorine substituted carboxyl group, a fluorine substituted (meth)acryl group, a fluorine substituted glycidylether group, or a combination thereof; and $0<a,b,c,w,x,y,z<0.9$, $0\leq m,n,p<0.9$, and $a+b+c+m+n+p+w+x+y+z=1$;

at least one photovoltaic solar cell with at least one layer of encapsulant disposed on a surface of the photovoltaic solar cell; and a back cover-sheet, wherein the front cover-glass with the coating has an anti-reflective property, a hydrophobic property and an enhanced ion-migration blocking property when compared to the same front cover-glass without the coating;

wherein the front cover-glass is coated on at least one surface selected from the surfaces consisting of: a front surface, a back surface, and at least one edge surface.

26. The solar module of claim 25, the coating further comprising an additive selected from the group consisting of $SnO_2$, $Al_2O_3$, $ZrO_2$, $HfO_2$, $Si_3N_4$, and $Ce_2O_3$, wherein a sheet resistance of the front cover glass is reduced when compared to an uncoated sheet resistance of the front cover glass.

27. The solar module of claim 26, wherein the additive is in the form of nanoparticles.

* * * * *